(12) United States Patent
Ota

(10) Patent No.: US 11,664,225 B2
(45) Date of Patent: May 30, 2023

(54) IMPRINT APPARATUS, AND PRODUCT MANUFACTURING METHOD

(71) Applicant: CANON KABUSHIKI KAISHA, Tokyo (JP)

(72) Inventor: Jun Ota, Toyonaka (JP)

(73) Assignee: Canon Kabushiki Kaisha, Tokyo (JP)

( * ) Notice: Subject to any disclaimer, the term of this patent is extended or adjusted under 35 U.S.C. 154(b) by 114 days.

(21) Appl. No.: 16/245,124

(22) Filed: Jan. 10, 2019

(65) Prior Publication Data

US 2019/0148124 A1 May 16, 2019

Related U.S. Application Data

(63) Continuation of application No. PCT/JP2017/025238, filed on Jul. 11, 2017.

(30) Foreign Application Priority Data

Jul. 15, 2016 (JP) .............................. JP2016-140804

(51) Int. Cl.
 *B05C 11/10* (2006.01)
 *H01L 21/027* (2006.01)
 (Continued)

(52) U.S. Cl.
 CPC .............. *H01L 21/027* (2013.01); *B05C 9/08* (2013.01); *B05C 11/1021* (2013.01);
 (Continued)

(58) Field of Classification Search
 None
 See application file for complete search history.

(56) References Cited

U.S. PATENT DOCUMENTS 4,563,689 A * 1/1986 Murakami ............. B41J 2/2128
 347/11
7,360,851 B1 * 4/2008 Snyder ..................... B41J 3/407
 347/2
(Continued)

FOREIGN PATENT DOCUMENTS

JP 2011-199052 A 10/2011
JP 2012-054322 A 3/2012
(Continued)

OTHER PUBLICATIONS

*Intel Corp. v. U.S. Int'l Trade Commission*, 946 F.2d 821, 20 U.S.P.Q.2d 1161, 13 ITRD 1717 (Fed. Cir. 1991), Court Opinion.*

*Primary Examiner* — Charles Capozzi
(74) *Attorney, Agent, or Firm* — Canon U.S.A., Inc., IP Division

(57) ABSTRACT

An imprint apparatus forms imprint material using a mold on a substrate. The imprint apparatus includes a movable stage configured to hold the substrate, a supply portion configured to discharge the imprint material, and a control unit configured to cause the supply portion to discharge the imprint material while moving the stage so that the imprint material is supplied onto the substrate. The control unit controls discharge of the imprint material from the supply portion so that a target amount of the imprint material is arranged at a target position on the substrate, based on property information indicating a relation between a discharge amount of imprint material from the supply portion and a position on a target object where the imprint material is to be arranged.

13 Claims, 9 Drawing Sheets

(51) Int. Cl.
- *B81C 1/00* (2006.01)
- *G03F 7/00* (2006.01)
- *B05C 9/08* (2006.01)
- *B29C 59/02* (2006.01)

(52) U.S. Cl.
CPC ................ *B29C 59/02* (2013.01); *B81C 1/00* (2013.01); *G03F 7/0002* (2013.01)

(56) References Cited

U.S. PATENT DOCUMENTS

| | | | | |
|---|---|---|---|---|
| 2007/0228593 | A1* | 10/2007 | Jones | B82Y 40/00 264/40.4 |
| 2011/0151124 | A1* | 6/2011 | Ina | B82Y 10/00 427/277 |
| 2012/0050441 | A1* | 3/2012 | Mikami | B82Y 40/00 347/110 |
| 2013/0020281 | A1* | 1/2013 | Wakamatsu | G03F 7/0002 216/40 |

FOREIGN PATENT DOCUMENTS

| | | |
|---|---|---|
| JP | 2013-065624 A | 4/2013 |
| JP | 2014-103189 A | 6/2014 |
| JP | 5727905 B2 | 6/2015 |
| JP | 2016-004794 A | 1/2016 |
| JP | 2016-027623 A | 2/2016 |
| JP | 2016-092270 A | 5/2016 |

* cited by examiner

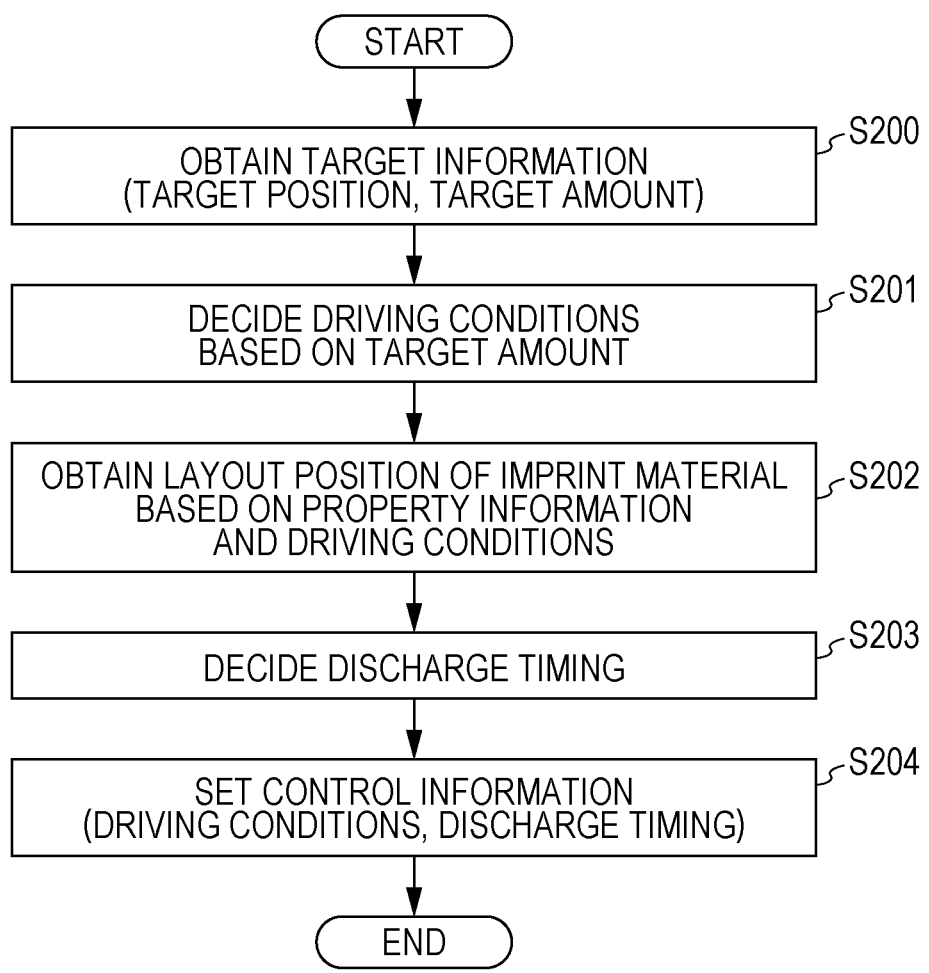

IMPRINT APPARATUS, AND PRODUCT MANUFACTURING METHOD

CROSS-REFERENCE TO RELATED APPLICATIONS

This application is a Continuation of International Patent Application No. PCT/JP2017/025238, filed Jul. 11, 2017, which claims the benefit of Japanese Patent Application No. 2016-140804, filed Jul. 15, 2016, both of which are hereby incorporated by reference herein in their entirety.

TECHNICAL FIELD

The present invention relates to an imprint apparatus and a product manufacturing method.

BACKGROUND ART

Demand for miniaturization such as semiconductors and MEMS has advanced, and microfabrication technology, where a pattern of imprint material is formed on a substrate by forming imprint material on a substrate by a mold is gathering attention, in addition to conventional photolithography technology. This technology is referred to as imprint technology. Imprint technology enables fine structures, in the order of several nanometers, to be formed on a substrate. One type of imprint technology is photocuring. In an imprint apparatus employing photocuring, first, an imprint material is applied to a pattern forming region on a substrate. Next, a mold is brought into contact with the imprint material, and the imprint material is allowed to fill recesses in the pattern region of the mold. Next, the imprint material is irradiated by ultraviolet rays to harden the imprint material, thereby forming a pattern corresponding to the recesses. Next, the mold is distanced (separated) from the hardened imprint material, thereby leaving a pattern formed of the imprint material on the substrate.

A discharge portion that discharges imprint material may be used in an imprint apparatus, to arrange imprint material on the substrate. The imprint material may be arranged at target positions on the substrate by discharging imprint material from the discharge portion at controlled timings, while moving the substrate. Generally, imprint materials are arranged at each of multiple target positions on the substrate, and a mold is brought into contact with these imprint materials, whereby the imprint materials spread to form a film, and also fill the recesses of the mold.

The positions and amount of imprint material arranged on the substrate can affect the thickness and distribution of patterns formed on the substrate. Also, if the positions and amount of imprint material arranged on the substrate are inappropriate, defects can occur in the patterns formed on the substrate. PTL 1 describes a method of controlling the amount of discharge of ink droplets from the nozzle.

CITATION LIST

Patent Literature

PTL 1 Japanese Patent No. 5727905

Adjusting the discharge amount of imprint material can change the speed of imprint material in accordance with the discharge amount thereof. Accordingly, in the method of arranging the imprint material on the substrate by discharging the imprint material from the discharge portion while moving the substrate, adjusting the discharge amount of imprint material can cause the position where imprint material is supplied to the substrate for the discharge position to deviate from the target position. This can be disadvantageous from the point of accurate pattern formation, such as causing local excess or insufficiency of imprint material, increasing unfilled defects and non-uniformity in residual layer thickness, for example, or the like.

It is an object of the present invention to provide, for example, an imprint apparatus that is advantageous from the point of accurate pattern formation.

SUMMARY OF INVENTION

One aspect of the present invention relates to an imprint apparatus that forms imprint material using a mold on a substrate. The imprint apparatus includes a movable stage configured to hold the substrate, a supply portion configured to discharge the imprint material, and a control unit configured to cause the supply portion to discharge the imprint material while moving the stage so that the imprint material is supplied onto the substrate. The control unit controls discharge of the imprint material from the supply portion so that a target amount of the imprint material is arranged at a target position on the substrate, based on property information indicating a relation between a discharge amount of imprint material from the supply portion and a position on a target object where the imprint material is to be arranged.

Further features of the present invention will become apparent from the following description of exemplary embodiments with reference to the attached drawings.

BRIEF DESCRIPTION OF DRAWINGS

FIG. 4 is a diagram illustrating a flow of discharge control of imprint material from the supply portion, executed by a control unit.

DESCRIPTION OF EMBODIMENTS

The present invention will be described below by way of an exemplary embodiment, with reference to the attached drawings.

Figure 1:
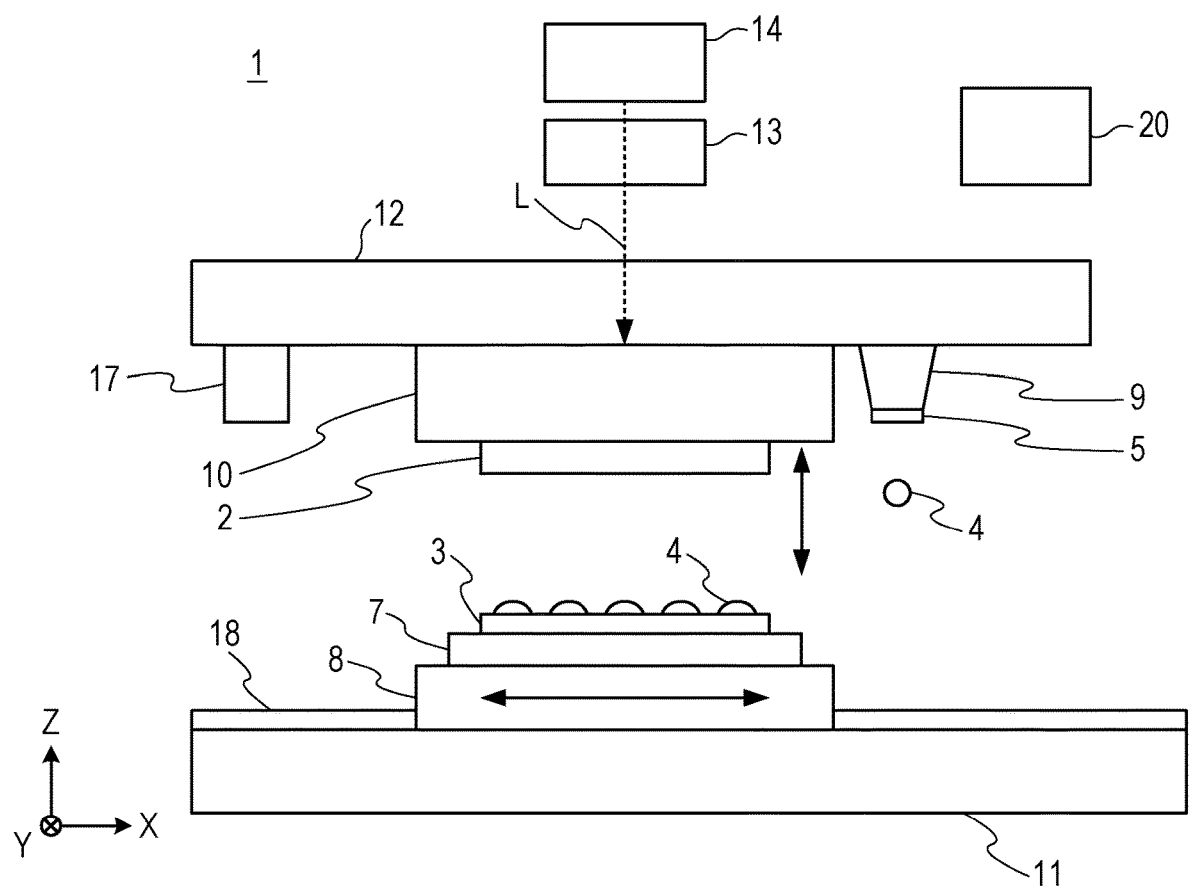
FIG. 1 is a diagram illustrating the configuration of an imprint apparatus according to an embodiment of the present invention.

FIG. 1 illustrates the configuration of an imprint apparatus 1 according to an embodiment of the present invention. The imprint apparatus 1 is configured to form imprint material 4 on a substrate 3 using a mold 2.

A curable composition (also may be referred to as resin in an uncured state) that hardens by being provided with hardening energy is used as the imprint material. Electromagnetic waves, heat, and so forth may be used as the hardening energy. Electromagnetic waves may be light selected from a range in wavelength from 10 nm or more to 1 mm or lower, for example, such as infrared light, visible light, ultraviolet light, or the like, for example. The curable composition may be a composition that hardness by irradiation of light or by heating. Of these, a photocuring composition that hardens under light may include at least a polymerizable compound and a photopolymerization initiator, and may further include a non-polymerizable compound or solvent as necessary. A non-polymerizable compound is at least one type selected from a group of sensitizers, hydrogen donors, internal release agents, surfactants, antioxidants, polymer components, and so forth. The imprint material may be arranged on the substrate by the discharge portion in the form of droplets, or as islands or a film where multiple droplets have connected. The viscosity (viscosity at 25° C.) of the imprint material may be 1 mPa·s or more and 100 mPa·s or less, for example. Examples of the material for the substrate include glass, ceramics, metals, semiconductors, resins, and so forth. A member formed of a different material from that of the substrate may be provided on the surface of the substrate, as necessary. Examples of the substrate include silicon wafer, compound semiconductor wafer, and quartz glass.

In the Specification and attached drawings, an XYZ coordinate system is illustrated in which a direction parallel to the surface of the substrate 3 is the XY plane. Directions respectively parallel to the X axis, Y axis, and Z axis, in the XYZ axis, are the X direction, Y direction, and Z direction, and rotation on the X axis, rotation on the Y axis, and rotation on the Z axis, respectively are θX, θY, and θZ. Control or driving relating to the X axis, Y axis, and Z axis means control or driving in a direction parallel to the X axis, a direction parallel to the Y axis, and a direction parallel to the Z axis, respectively. Control or driving relating to the θX axis, θY axis, and θZ axis means control or driving relating to rotation on an axis parallel to the X axis, rotation on an axis parallel to the Y axis, and rotation on an axis parallel to the Z axis, respectively. Position is information that can be identified based on the coordinates of the X axis, Y axis, and Z axis, and attitude is information that can be identified by values of the θX axis, θY axis, and θZ. Positioning means control of position and/or attitude. Alignment may include control of position and/or attitude of at least one of the substrate and mold.

In the following, an example of using light as the energy for hardening the imprint material 4 will be described, in order to present a more specific example. Typically, the optical axis of light is parallel to the Z axis. The imprint apparatus 1 includes, for example, a light source 14, an illumination system 13, a mold driving mechanism 10, a substrate stage (stage) 8, a substrate driving mechanism 18, a structure 12, a supply portion 9, a measuring unit 17, and a control unit 20.

The light source 14 generates light for hardening the imprint material 4 (e.g., ultraviolet light). The illumination system 13 illuminates the imprint material 4 on the substrate 3 via the mold 2 using light L from the light source 14, thereby hardening the imprint material 4. Note that in a case of using a thermosetting resin material as the imprint material 4, a heat supply unit that supplies heat to the imprint material 4 is provided instead of the light source 14 and illumination system 13.

The mold 2 has pattern portions (omitted from illustration) facing the substrate 3. The pattern portions have a pattern of such as a circuit pattern or the like to be transferred to the substrate 3 (imprint material 4), for example. The pattern is configured of recesses, and the recesses are filled with imprint material 4 in a state where the pattern portions of the mold 2 are in contact with the imprint material 4 on the substrate 3. The mold driving mechanism 10 is supported by the structure 12. The mold driving mechanism 10 can drive the mold 2 by a mold chuck (omitted from illustration) that holds the mold 2. The mold 2 can be driven by driving the mold chuck. The mold chuck holds the mold 2 by adsorption (e.g., vacuum suction, electrostatic adsorption) of a region of the mold 2 around the optical path of the light L, for example. The mold driving mechanism 10 may have a mold deformation mechanism that deforms the mold 2. The mold driving mechanism 10 drives the mold 2 with regard to multiple axis (e.g., the six axes of X axis, Y axis, Z axis, θX axis, θY axis, and θZ axis).

The substrate stage 8 has a substrate chuck 7 that holds the substrate 3. The substrate stage 8 is a movable stage that is driven by the substrate driving mechanism 18. The substrate driving mechanism 18 drives the substrate stage 8 on a stage plate 11 so that the substrate 3 is driven with regard to multiple axis (e.g., the three axes of X axis, Y axis, and θZ axis). The mold driving mechanism 10 and substrate driving mechanism 18 make up an adjustment mechanism for adjusting the relative position of the substrate 3 and mold 2. The adjustment mechanism adjusts the relative position of the substrate 3 and mold 2 with regard to the X axis, Y axis, θX axis, θY axis, and θZ axis, and also adjusts the relative position of the substrate 3 and mold 2 with regard to the Z axis. Adjustment of the relative position of the substrate 3 and mold 2 with regard to the Z axis includes operations of contact and separation of the imprint material 4 on the substrate 3 and the mold 2.

The supply portion (coating portion) 9 may be supported by the structure 12 and disposed near to the mold driving mechanism 10. The supply portion 9 supplies the imprint material 4 to a shot region serving as a pattern forming region of the substrate 3. More specifically, the supply portion 9 has a discharge portion 5 that discharges the imprint material 4, and discharges the imprint material 4 from the discharge portion 5 so that the imprint material 4 is supplied to the shot region on the substrate 3. The discharge portion 5 is configured to discharge the imprint material 4 following a principle similar to the principle by which ink jet printers discharge ink.

The control unit 20 is configured to control the mold driving mechanism 10, substrate driving mechanism 18, light source 14, supply portion 9, measuring unit 17, and so forth. The control unit 20 may perform, for example, control of the mold driving mechanism 10 and the substrate driving mechanism 18 for positioning of the pattern forming region on the substrate 3 and the mold 2, and control of the substrate driving mechanism 18 and supply portion 9 to supply the imprint material 4 to the pattern forming region on the substrate 3. The control unit 20 may also perform control of the light source 14 for hardening the imprint material 4. The control unit 20 may be configured of a PLD (acronym for Programmable Logic Device.) such as an FPGA (acronym for Field Programmable Gate Array.), or an ASIC (acronym for Application Specific Integrated Circuit.), or a general-purpose computer with a built-in program, or all of these or a combination of a part thereof, for example.

Next, imprinting processing by the imprint apparatus 1 (imprinting method) will be described. First, the control unit 20 causes a substrate conveying mechanism, omitted from illustration, to load the substrate 3 on the substrate chuck 7, and fix the substrate 3 on the substrate chuck 7. Next, the control unit 20 causes an alignment scope, omitted from illustration, to measure the positions of alignment marks on the substrate 3. At this time, the control unit 20 controls the substrate driving mechanism 18 so that the alignment marks on the object of measurement are in the field of view of the alignment scope. The control unit 20 identifies the positions of multiple shot regions (pattern forming regions) defined on the substrate 3 based on the measurement results by the alignment scope. The positions of the multiple shot regions are used for operations of supplying the imprint material 4 to the shot regions by the supply portion 9, and positioning of the mold 2 as to shot regions where the imprint material has been supplied.

Figure 2A:
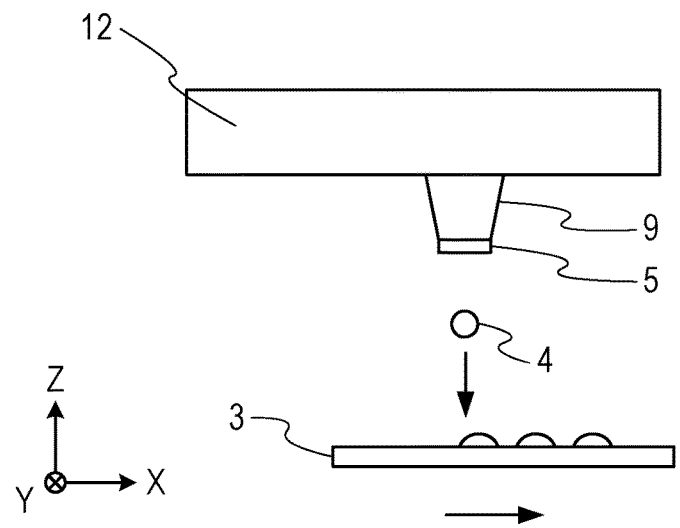
FIGS. 2A and 2B are diagrams for describing supply of imprint material to a substrate by a supply portion.
Figure 2B:
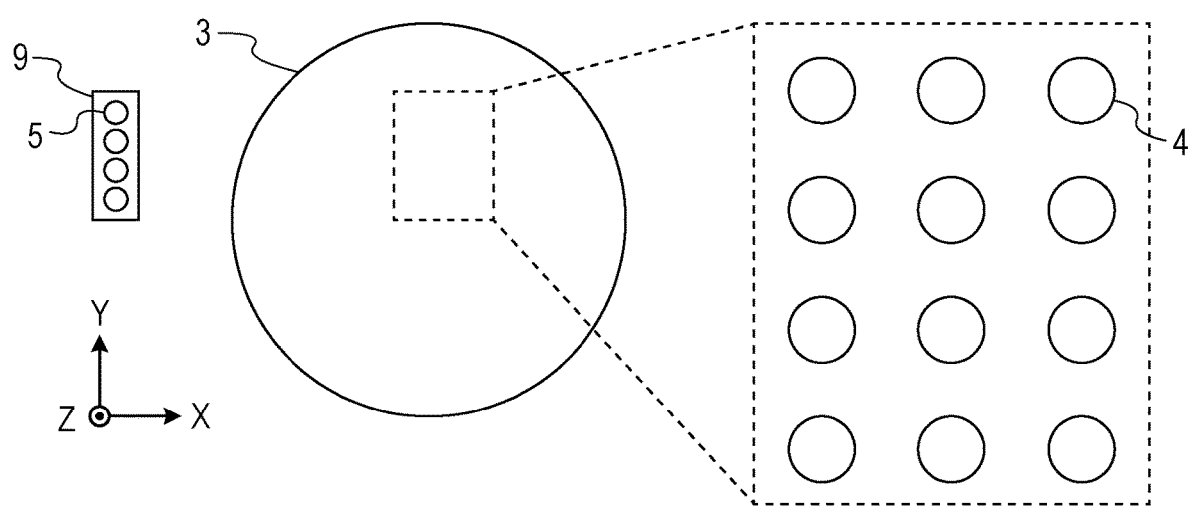

Next, the control unit 20 controls the supply portion 9 and substrate driving mechanism 18 so that imprint material 4 is supplied to shot regions that are the object of pattern formation. Supply of the imprint material 4 to the short regions of the substrate 3 by the supply portion 9 will be described with reference to FIGS. 2A and 2B. The control unit 20 controls the substrate driving mechanism 18 so that a shot region that is the object of pattern formation is positioned below the supply portion 9. The control unit 20 then causes the discharge portion 5 of the supply portion 9 to discharge imprint material 4 while causing the substrate driving mechanism 18 to be driven following the XY plane of the substrate 3 (substrate stage 8), as illustrated in FIG. 2A. Accordingly, the imprint material 4 is supplied and arranged on the shot regions that are the object of imprinting on the substrate 3, as illustrated in FIG. 2B. Typically, imprint material 4 may be arranged at multiple positions of the shot regions that are the object of imprinting.

Next, the control unit 20 positions the substrate 3 (substrate stage 8) as to the substrate driving mechanism 18, so that the shot regions that are the object of pattern formation where the imprint material 4 has been arranged are situated below the mold 2. The control unit 20 then controls the substrate driving mechanism 18 and mold driving mechanism 10 while detecting the relative position between the shot regions that are the object of pattern formation and the mold 2, using an alignment scope that is omitted from illustration, thereby performing alignment of the shot region and the mold 2. Next, the control unit 20 controls the relative position of the substrate 3 and the mold 2 so that the pattern portions of the mold 2 are pressed against the imprint material 4 in the shot regions that are the object of pattern formation. For example, the control unit 20 controls the relative position of the substrate 3 and the mold 2 so that the pattern portions of the mold 2 are pressed against the imprint material 4 in the shot regions by causing the mold driving mechanism 10 to lower the mold 2. This pressing causes the imprint material 4 in the shot regions to spread and form a film, and to fill the recesses of the pattern portions of the mold 2.

Next, the control unit 20 controls the light source 14 so that the imprint material 4 in the shot regions that are the object of pattern formation are irradiated by the light L, thereby hardening the imprint material 4 by the light L. The control unit 20 then controls the relative position of the substrate 3 and mold 2 so that the mold 2 is separated from the hardened imprint material 4. For example, the control unit 20 controls the relative position of the substrate 3 and mold 2 so that the mold 2 is separated from the hardened imprint material 4 in the shot regions, by causing the mold driving mechanism 10 to raise the mold 2. According to the above processes, patterns according to the patterns in the pattern portions of the mold 2 are transferred to the shot region of the substrate 3 to where patterns are to be formed. This process can be executed on multiple shot regions.

At the time of layout out the imprint material 4 on the substrate 3 by the supply portion 9, the control unit 20 controls discharge of the imprint material 4 from the supply portion 9 based on target information generated in accordance with a pattern layout formed in the pattern portions of the mold 2. The target information may be provided from an eternal device or a storage medium. The target information includes multiple positions (target positions) where imprint material should be arranged on the substrate 3 or in the shot regions, and the amount of imprint material (target amounts) that should be arranged in each of the multiple positions. The target information is decided such that the imprint material 4 spreads without any gaps when the pattern portions of the mold 2 are brought into contact with the layout of the imprint material 4 in the shot regions.

In the present embodiment, the control unit 20 controls discharge of imprint material 4 from the supply portion 9 so that imprint material 4 of target amounts is arranged at target positions of the substrate 3, based on property information set beforehand. Property information here is information indicating the relation between the discharge amount of imprint material 4 from the supply portion 9 and the position where the imprint material 4 of this discharge amount is arranged on the target object (subject). Specifically, the control unit 20 may be configured to decide discharge timing of the imprint material from the supply portion 9, based on property information, the target amount of imprint material to be supplied (discharged) and the target position to which to supply the imprint material. In a case where the discharge amount of imprint material from the supply portion 9 is discretely controlled by driving conditions, the control unit 20 may be configured to decide the driving conditions based on the target amount, and decide the discharge timing based on property information, driving conditions decided in accordance with the target amount, and the target position.

Now, there is a correlation between the discharge amount of the imprint material 4 and the velocity of the imprint material 4 discharged from the discharge portion 5 of the supply portion 9, where increasing the discharge amount of the imprint material 4 causes the velocity of the imprint material 4 to decrease. In a method of discharging imprint material 4 from the discharge portion 5 of the supply portion 9 while moving the substrate 3, so as to supply onto the substrate 3, the position on the substrate 3 where the imprint material 4 is supplied changes when the velocity of the imprint material 4 changes. Accordingly, when changing the discharge amount of imprint material 4 from a previous discharge amount to a target amount, the discharge timing of discharging the imprint material 4 from the discharge portion 5 of the supply portion 9 needs to be changed from the previous discharge timing as well. Accordingly, the control unit 20 may be configured to decide the discharge timing based on property information, target amount, and target position.

Figure 3:
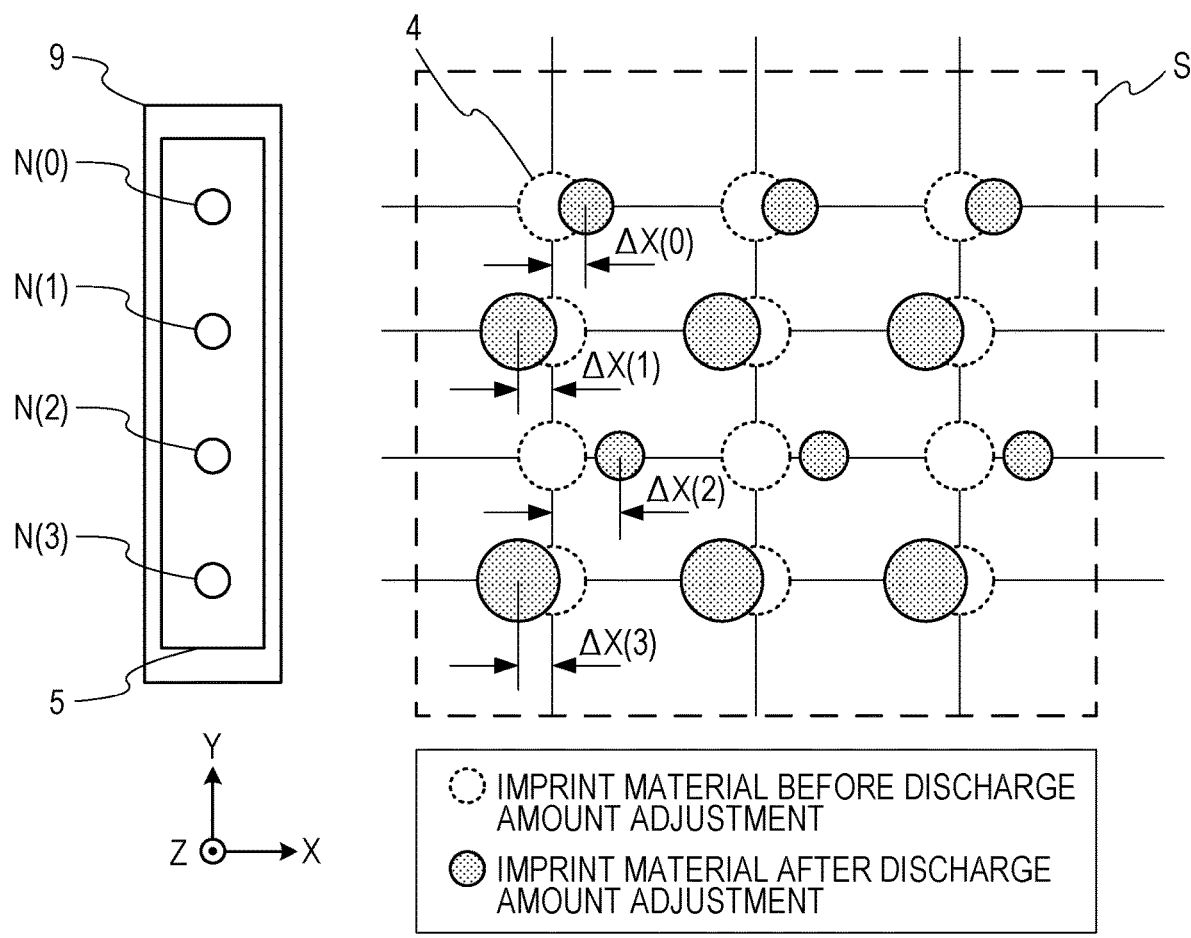
FIG. 3 is a diagram for describing adjustment of the discharge mount of imprint material from the supply portion.

FIG. 3 exemplarity illustrates that the supply positions of imprint material 4 to a shot region S on the substrate change when adjusting the discharge amount of the imprint material 4 from the supply portion 9. The white circles (dotted lines)

indicate the positions where the imprint material 4 previously was supplied onto the target object before adjudgment of discharge amount. The array of imprint material 4 before adjustment of discharge amount is a grid. The filled-in circles (solid lines) indicate the positions where the imprint material 4 was supplied onto the target object after adjustment of discharge amount.

In the example illustrated in FIG. 3, four discharge orifices, identified as discharge orifices N(0), N(1), N(2), and N(3) are provided to the discharge portion 5 of the supply portion 9. The imprint material 4 of the i'th row in the shot region S represents the imprint material 4 discharged from discharge orifice N(i) (where i is one of 1 through 3) and supplied to the shot region S. The example in FIG. 3 is an example where the discharge orifices N(0) and N(2) have been adjusted to reduce the discharge amount in comparison to the discharge amount before adjustment, and the discharge orifices N(1) and N(3) have been adjusted to increase the discharge amount in comparison to the discharge amount before adjustment. The positions where the imprint material 4 is supplied to the shot region S by the change in discharge amount also is changed. Accordingly, simply adjusting the discharge amount does not result in the imprint material 4 being supplied to the target positions on the substrate 3, and the film thickness of the formed patterns (e.g., residual layer thickness (the film thickness at the thinnest portion)) may be non-uniform. Accordingly, there is a need to adjust the discharge timing as well as adjusting the discharge amount.

Figure 5A:
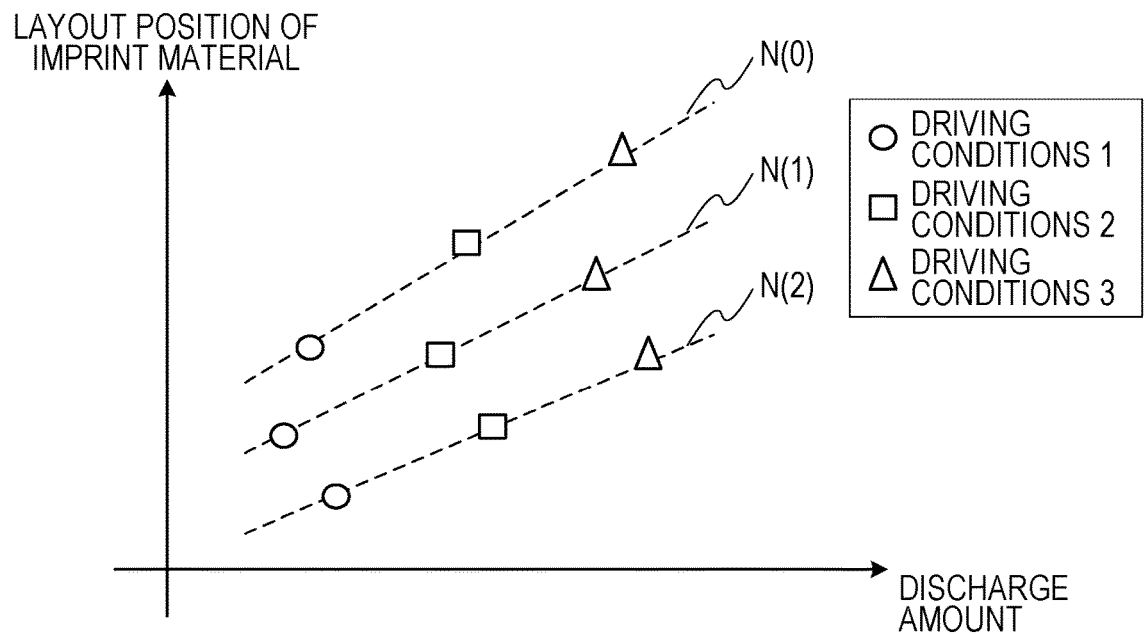
FIGS. 5A and 5B are diagrams exemplifying a relation (property information) between driving conditions of driving elements corresponding to each of multiple discharge orifices, and layout positions where imprint material discharged from discharge orifices is arranged under each of the driving conditions on the substrate.
Figure 5B:
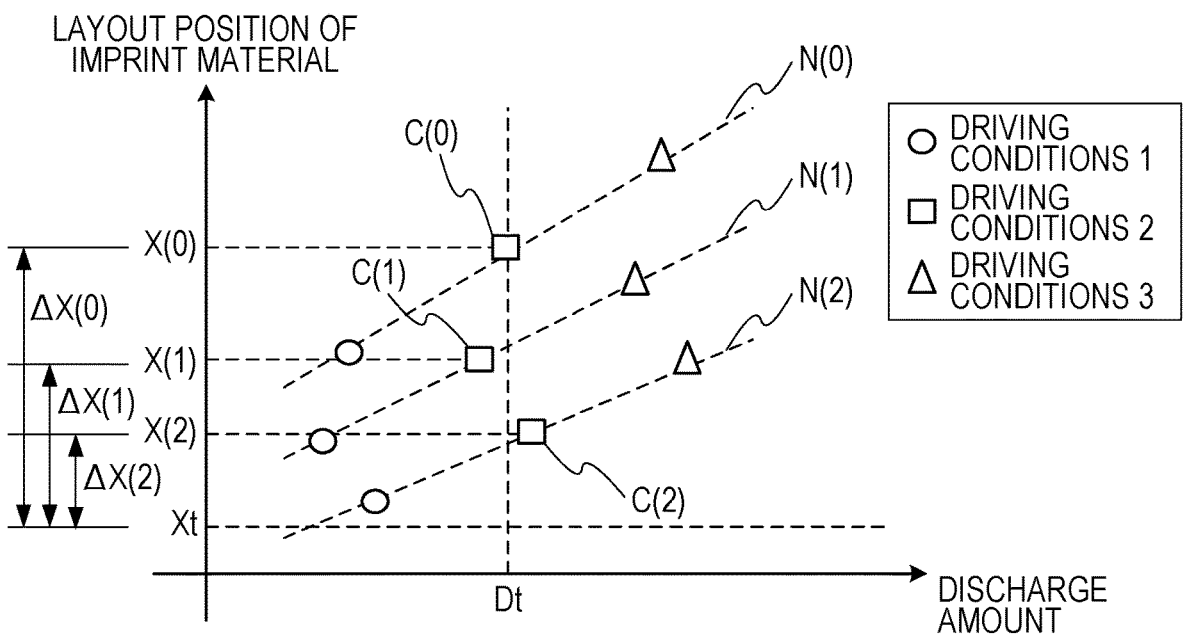
Figure 6A:
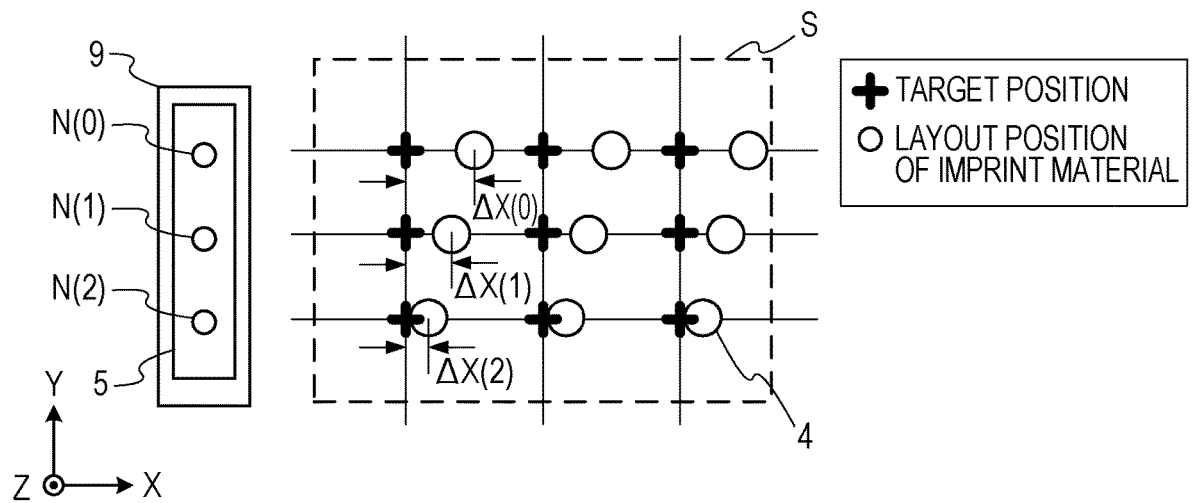
FIGS. 6A and 6B are diagrams for describing correction of positioning positions of imprint material by decision of discharge timing in accordance with discharge conditions.
Figure 6B:
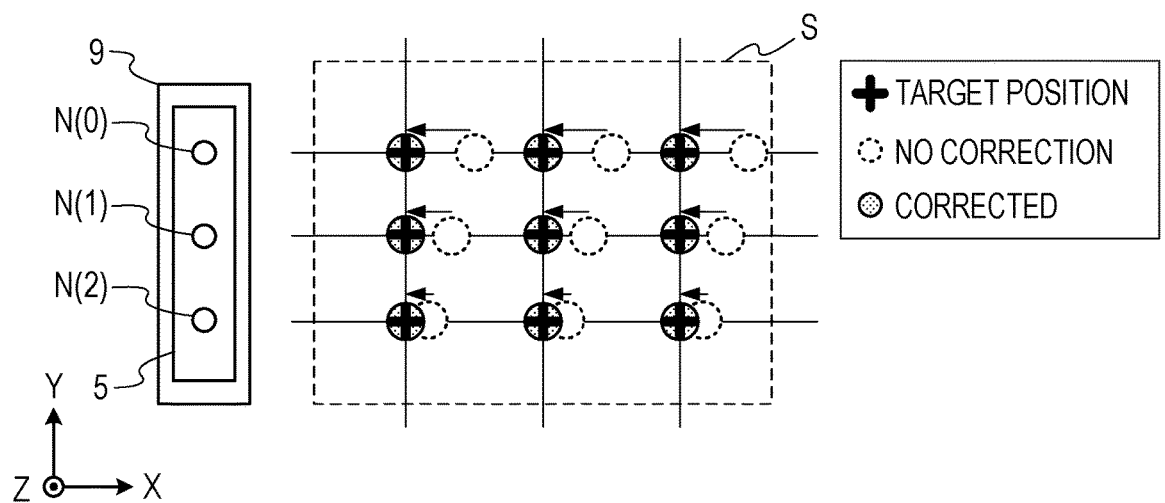

FIG. 4 illustrates the flow of control of discharge of the imprint material 4 from the supply portion 9 that the control unit 20 executes. In FIG. 5A, property information is illustrated in a visualized manner. In FIG. 5B, decision of driving conditions based on the target amount (target discharge amount) is exemplarily illustrated. FIG. 5B also exemplarily illustrates that deviation of the layout position of imprint material on the substrate 3 (positions where imprint material is supplied to the substrate 3) occurs in accordance with the target amount. FIG. 6A illustrates that the layout position of the imprint material 4 on the substrate 3 changes due to change in the discharge amount. FIG. 6B illustrates that the layout position of the imprint material 4 on the substrate 3 is corrected by adjustment in discharge timing. Assumption will be made in the description following FIG. 4 that property information has been obtained and stored beforehand. However, the control unit 20 may be configured to executed processing to generate property information, which will be described later. Property information may be provided as a function or a table or the like, for example.

First, in process S200, the control unit 20 obtains target information including multiple positions regrading which imprint material is to be arranged on the substrate 3 or in the shot region (hereinafter, target positions) and amounts of imprint material to be arranged at each of the multiple positions (hereinafter, target amounts). The target information may be provided from an external device or storage medium.

In process S201, the control unit 20 decides driving conditions of driving elements corresponding to the discharge orifices of the discharge portion 5 of the supply portion 9, based on the target amounts in the target information. Driving elements corresponding to the discharge orifices means driving elements for discharge imprint material from the relevant discharge orifices, i.e., driving elements provided to the discharge orifices. Here, FIG. 5A exemplarily illustrates the relation between driving conditions of the driving elements corresponding to the discharge orifices N(0), N(1), and N(2) (e.g., driving voltage), and the layout position where the imprint material discharged from the discharge orifices under each of the driving conditions is arranged on the substrate.

With the target position obtained in process S200 as Xt, and the target amount as Dt, the driving conditions where the deviation as to the target amount Dt is smaller than a predetermined value can be decided for the driving elements corresponding to each of the discharge orifices, as illustrated in FIG. 5B. For the driving conditions C(0) of the driving element corresponding to discharge orifice N(0), driving condition 2 is decided out of the multiple driving conditions 1, 2, and 3. For the driving conditions C(1) of the driving element corresponding to discharge orifice N(1), driving condition 2 is decided out of the multiple driving conditions 1, 2, and 3. For the driving conditions C(2) of the driving element corresponding to discharge orifice N(2), driving condition 2 is decided out of the multiple driving conditions 1, 2, and 3.

In process S202, the control unit 20 decides the layout positions of imprint material before correction of the discharge timing, based on the property information stored beforehand, the driving conditions decided in process S201, and the target position Xt obtained in process S200. It can be seen from the property information illustrated in FIG. 5B that the layout positions where the imprint material 4 discharged from discharge orifices N(0), N(1), and N(2) under the driving conditions C(0), C(1), and C(2) decided in process S201 is arranged are X(0), X(1), and X(2).

In process S203, the control unit 20 decides the discharge timings TC(0), TC(1), and TC(2) of imprint material from the discharge orifices N(0), N(1), and N(2), based on the layout positions X(0), X(1), and X(2) decided in process S202. Specifically, the control unit 20 decides the discharge timings TC(0), TC(1), and TC(2) for the driving elements corresponding to the discharge orifices N(0), N(1), and N(2), based on the layout positions X(0), X(1), and X(2) and the target position Xt, according to the following expressions.

$$TC(0) = T(0) - \Delta T(0)$$
$$= T(0) - \Delta X(0)/V$$
$$= T(0) - (X(0) - Xt)/V$$

$$TC(1) = T(1) - \Delta T(1)$$
$$= T(1) - \Delta X(1)/V$$
$$= T(1) - (X(1) - Xt)/V$$

$$TC(2) = T(2) - \Delta T(2)$$
$$= T(2) - \Delta X(2)/V$$
$$= T(2) - (X(2) - Xt)/V$$

Here, T(0) is a discharge timing serving as a reference (the discharge timing before correction), and may be, for example, a timing at which the discharge orifices N(0), N(1), and N(2) face the target position Xt, or a timing earlier than this timing by a predetermined amount of time. V is the velocity of the substrate 3 (substrate stage 8) when the imprint material 4 is arranged on the substrate 3 by the supply portion 9. $\Delta X(i)$ is the difference between X(i) (where i is one of 0 through 2) and Xt. The discharge timings TC(0), TC(1), and TC(2) are corrected discharge timings.

In process S204, the control unit 20 sets control information made up of the driving conditions decided in process S201 and the discharge timings decided in process S203.

When arranging the imprint material 4 on the substrate 3 using the supply portion 9, the control unit 20 controls the driving conditions and discharge timings of the discharge portion 5 of the supply portion 9 based on the control information.

The + marks in FIG. 6A indicate the target positions Xt. The circles in FIG. 6A indicate the layout positions of the imprint material in the shot region S of the substrate in a case where the driving elements corresponding to discharge orifices N(0), N(1), and N(2) of the discharge portion 5 of the supply portion 9 are driven at discharge timing T(0), under the driving conditions decided in process S201. The + marks in FIG. 6B indicate the target positions Xt. The dotted line circles in FIG. 6B indicate the same layout positions as the circles in FIG. 6A. In FIG. 6B, the solid line circles indicate the layout positions of the imprint material in the shot region S of the substrate in a case where the driving elements corresponding to discharge orifices N(0), N(1), and N(2) of the discharge portion 5 of the supply portion 9 are driven at the discharge timings TC(0), TC(1), and TC(2).

As described above, according to the present embodiment, discharge of imprint material 4 from the supply portion 9 can be controlled such that imprint material 4 of target amounts can be arranged at target positions on the substrate 3, based on property information set beforehand.

Figure 7:
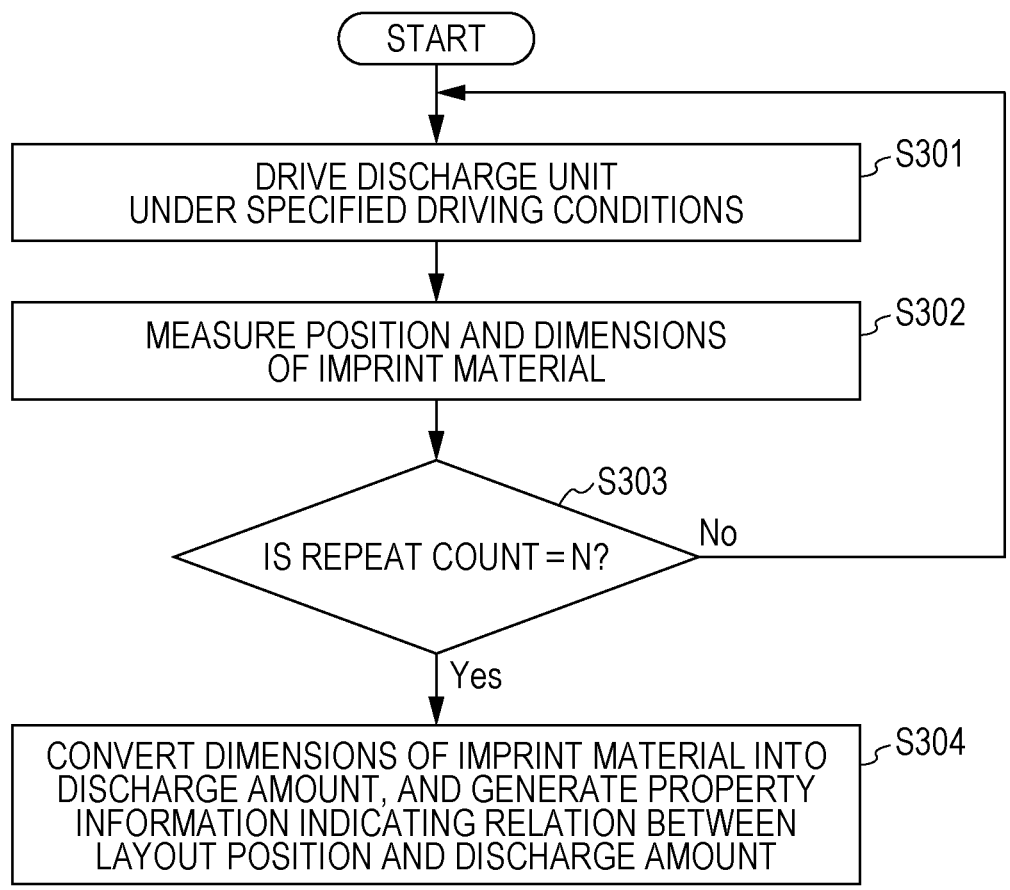
FIG. 7 is a diagram illustrating a flow of processing for generating property information.

Hereinafter, a method of generating property information will be exemplarily described. The control unit 20 may be configured to execute the processing of generating property information. FIG. 7 illustrates a flow of processing for generating property information. In the processing illustrated in this flow, processes S301 and S302 are executed relating to one driving condition, and processes S301 and S302 are executed with different driving conditions until judgment is made in process S303 that processes S301 and S302 have been executed an N count of driving conditions.

In process S301, the control unit 20 discharges imprint material 4 by driving the driving elements of the discharge portion 5 of the supply portion 9 under one driving condition out of multiple driving conditions, while moving the substrate 3 (substrate stage 8), and arranges imprint material 4 on a target object (described here as being a substrate 3 prepared for testing).

Figure 8A:
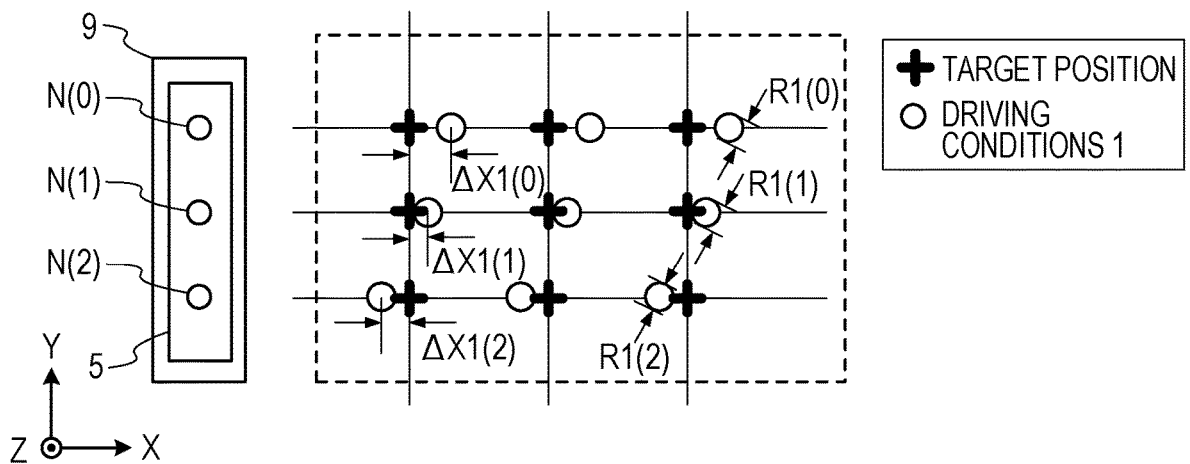
FIGS. 8A through 8C are diagrams describing processing for generating property information.

In process S302, the control unit 20 uses the measuring unit 17 to measure the dimensions (e.g., diameter) and layout position of the imprint material 4 arranged on the substrate 3 in process S301. FIG. 8A indicates imprint material arranged on the substrate 3 in a case of discharging the imprint material from the discharge orifices N(0), N(1), and N(2) under driving conditions 1 by circles. R1(0), R1(1), and R1(2) indicate the diameter of the imprint material arranged on the substrate 3 under driving conditions 1. ΔX1(0), ΔX1(1), and ΔX1(2) indicate the positional deviation of imprint material as to the target positions Xt, generated under driving conditions 1.

Figure 8B:
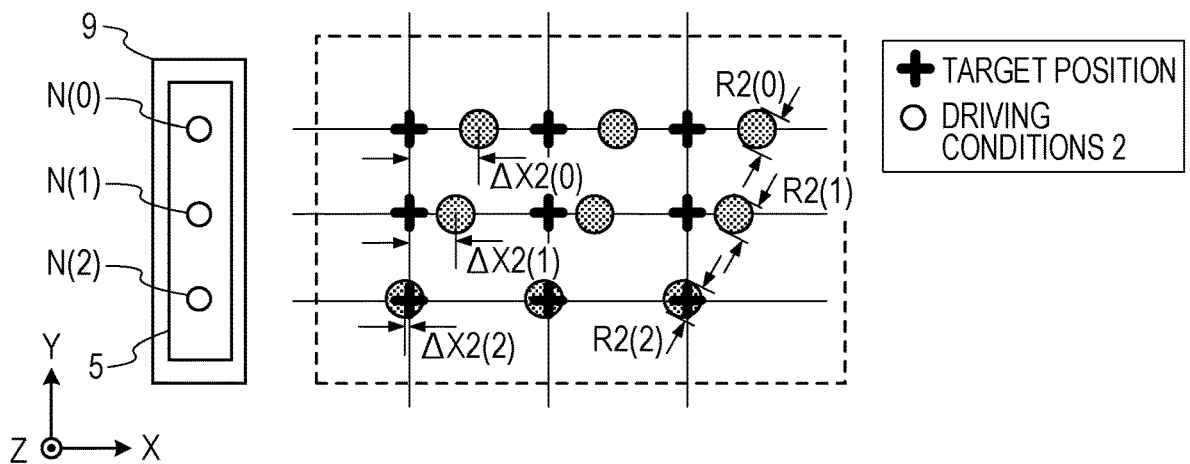

FIG. 8B indicates imprint material arranged on the substrate 3 in a case of discharging the imprint material from the discharge orifices N(0), N(1), and N(2) under driving conditions 2 by circles. R2(0), R2(1), and R2(2) indicate the diameter of the imprint material arranged on the substrate 3 under driving conditions 2. X2(0), X2(1), and X2(2) indicate the positional deviation of imprint material as to the target positions Xt, generated under driving conditions 2.

Figure 8C:
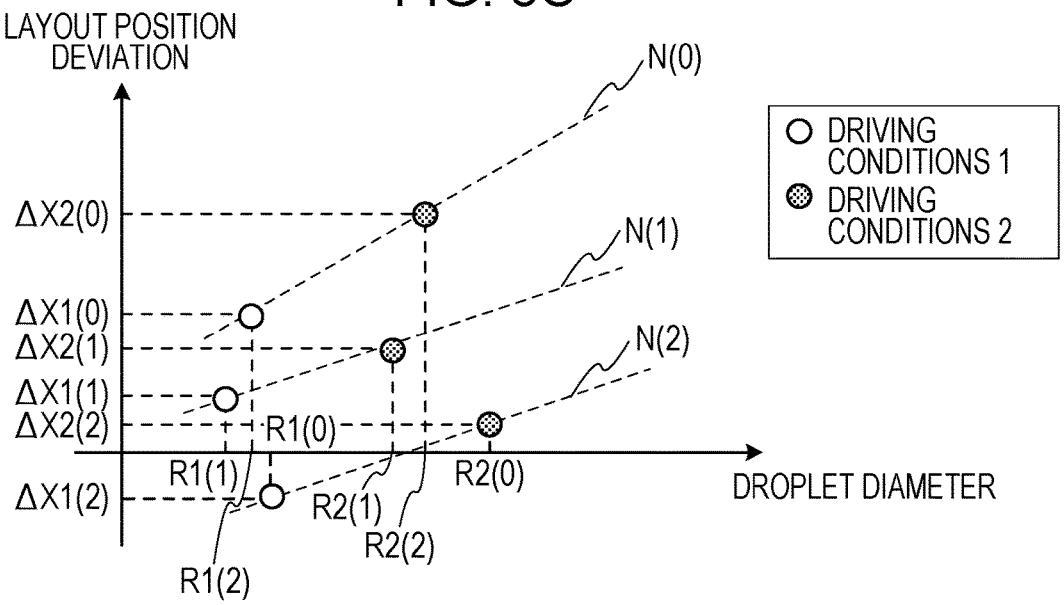

In process S304, the control unit 20 generates property information based on the layout positions and dimensions of imprint material under multiple driving conditions obtained by repeating processes S301 and S302. Here, the control unit 20 convers the dimensions of imprinting obtained by measuring in process S302 into discharge amount, based on the relation between dimensions and discharge amount of imprint material. The relation between dimensions and discharge amount of imprint material can be identified by experimentation and so forth beforehand, for each type of imprint material, and this relation may be prepared as a function or a table or the like, for example. FIG. 8C indicates property information obtained based on the results illustrated in FIGS. 8A and 8B.

Hardened article patterns formed using the imprint apparatus can be used permanently in at least part of various types of products, or temporarily in the manufacture of various types of products. Products are electric circuit elements, optical elements, MEMS, recording elements, sensors, or molds or the like. Examples of electric circuit elements include volatile or non-volatile semiconductor memory such as DRAM, SRAM, flash memory, MRAM, and so forth, semiconductor devices such as LSIs, CCDs, image sensors, and FPGAs, and so forth. Examples of molds include molds for imprinting, and so forth.

A hardened article pattern is either used as it is as a component member of at least a part of the above-described product, or is temporarily used as a resist mask. After etching, ion injection or the like, is performed in a substrate working process, the resist mask is removed.

Figure 9A:
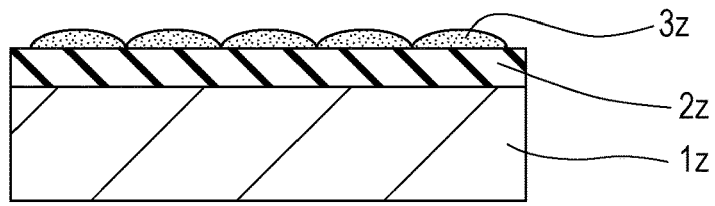
FIGS. 9A through 9F are diagrams describing a product manufacturing method.

Next, a method of manufacturing a product using the above-described imprint apparatus will be described. As illustrated in FIG. 9A, a substrate 1z such as a silicon wafer or the like, where a worked material 2z such as an insulator or the like is formed on the surface is prepared, following which an imprint material 3z is provided on the surface of the worked material 2z by the inkjet method or the like. The way in which the imprint material 3z has been provided on the surface of the substrate in the form of multiple droplets is illustrated here.

Figure 9B:
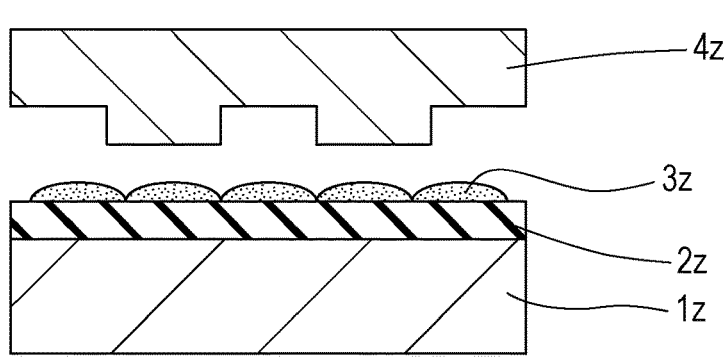
Figure 9C:
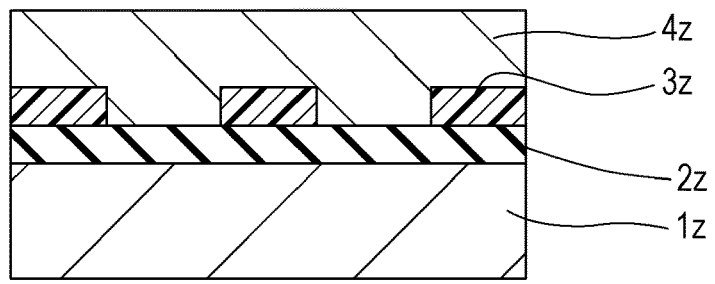

As illustrated in FIG. 9B, a mold 4z for imprinting is oriented so that a side thereof on which a protrusion and recess pattern has been formed faces the imprint material 3z on the substrate. As illustrated in FIG. 9C, the substrate 1z to which the imprint material 3z has been provided and the mold 4z are brought into contact, and pressure is applied. The imprint material 3z fills in the gaps between the mold 4z and the worked material 2z. Irradiation is performed by light, serving as hardening energy, through the mold 4z in this state, thereby hardening the imprint material 3z.

Figure 9D:
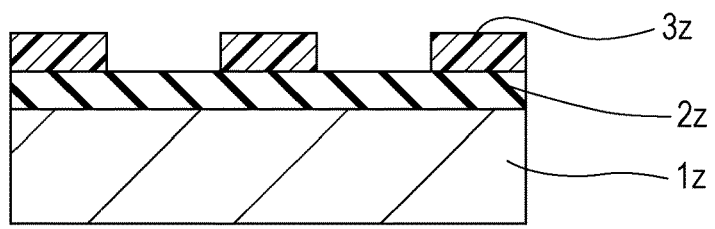

After the imprint material 3z has hardened, separating the mold 4z and the substrate 1z forms the hardened article pattern of the imprint material 3z on the substrate 1z, as illustrated in FIG. 9D. This hardened article pattern has a form where the recesses of the mold correspond to protrusions of the hardened article, and protrusions of the mold correspond to recesses of the hardened article, i.e., the protrusion and recess pattern of the mold 4z has been transferred to the imprint material 3z.

Figure 9E:
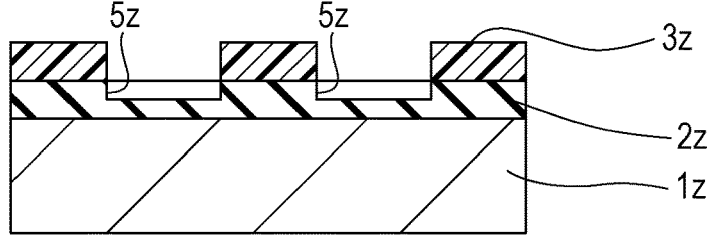
Figure 9F:
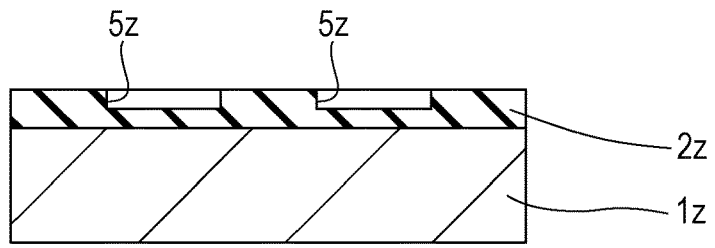

When using the hardened article pattern as an etching-resistant mask, the portions of the surface of the worked material 2z where there is none or only thinly remaining portions of hardened article are removed, forming grooves 5z, as illustrated in FIG. 9E. Note that the "thinly remaining portions" may be removed beforehand by a separate etching process. Removing the hardened article pattern yields a product where grooves 5z have been formed on the surface of the worked material 2z, as illustrated in FIG. 9F. Although the hardened article pattern is removed here, this may be left without removing after working, and used as an inter-layer insulating film included in a semiconductor device or the like, for example, i.e., used as a component member of the product.

According to the present invention, an imprint apparatus that is advantageous from the point of accurate pattern formation, for example, is provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint apparatus that forms imprint material using a mold on a substrate, the imprint apparatus comprising:
a movable stage configured to hold the substrate;
a supply portion configured to discharge the imprint material as a droplet and capable of varying droplet dimension of the imprint material on the substrate; and
a control unit configured to perform control of the moveable stage and the supply portion such that:
the supply portion discharges the imprint material while moving the stage so that a plurality of ink droplets of the imprint material are supplied onto the substrate, and
the control unit is configured to discharge the imprint material from the supply portion so that a target amount of the droplet of the imprint material is arranged at a target position on the substrate, based on property information indicating a relation between a discharge amount of each droplet of imprint material discharged from the supply portion and a position on a target object where the droplet of imprint material of that discharge amount is to be arranged, and
wherein the property information is information that indicates a position change of each droplet, which is increased or decreased in amount of the droplet discharged from the supply portion, to be supplied on the position on the target object.

2. The imprint apparatus according to claim 1, wherein the control unit is configured to obtain target information, indicating a plurality of target positions where imprint material is to be arranged on the substrate, and target amounts of imprint material to be arranged at each of the plurality of target positions, and generates control information for controlling the supply portion based on the target information and the property information.

3. The imprint apparatus according to claim 1, wherein the control unit is configured to generate the property information based on results of discharging imprint material from the supply portion onto the target object.

4. The imprint apparatus according to claim 3, wherein the control unit is configured to generate the property information based on positions and dimensions of the imprint material on the target object.

5. The imprint apparatus according to claim 4, further comprising:
a measurement unit configured to measure the positions and dimensions of the imprint material on the target object, wherein the control unit is configured to generate the property information based on results of measurement by the measurements unit.

6. The imprint apparatus according to claim 1, wherein the control unit is configured to decide a discharge timing of imprint material from the supply portion, based on the property information, target amounts, and target positions.

7. The imprint apparatus according to claim 6, wherein the control unit is configured to decide driving conditions of the supply portion based on the target amounts.

8. The imprint apparatus according to claim 7, wherein the control unit is configured to decide the discharge timing based on the property information, the driving conditions decided based on the target amounts, and the target positions.

9. The imprint apparatus according to claim 8, wherein the control unit is configured to select the driving conditions out of a plurality of driving conditions, based on the property information and the target amounts.

10. The imprint apparatus according to claim 9, wherein the control unit is configured to decide the discharge timing based on positions where imprint material is arranged on a target object under the driving conditions selected out of the plurality of driving conditions.

11. An imprint apparatus that forms imprint material using a mold on a substrate, the imprint apparatus comprising:
a movable stage configured to hold the substrate;
a supply portion configured to discharge the imprint material as a droplet and capable of varying droplet dimension of the imprint material on the substrate; and
a control unit configured to perform control of the moveable stage and the supply portion such that:
the supply portion discharges the imprint material while moving the stage so that the imprint material is supplied onto the substrate, and
the control unit is configured to discharge the imprint material from the supply portion based on driving conditions selected from a plurality of driving conditions for driving the supply portion, so that a target amount of the droplet of the imprint material is arranged at a target position on the substrate, based on property information indicating a relation between a discharge amount of each droplet of imprint material from the supply portion and a position on a target object where the the droplet of imprint material is to be arranged, and
wherein the property information is information that indicates a position change of each droplet, which is increased or decreased in amount of the droplet discharged from the supply portion, to be supplied on the position on the target object.

12. The imprint apparatus according to claim 1,
wherein the control unit is configured to determine a driving condition of the supply portion based on the target amount of the imprint material to be supplied on the target position on the substrate, and
wherein the control unit is configured to determine a discharge timing of the imprint material discharged from the supply portion based on the property information, the driving condition, and the target position.

13. The imprint apparatus according to claim 11,
wherein the control unit is configured to determine a supply position to supply an imprint material to be supplied at a discharge timing before correction, based on the property information, a driving condition, and the target position, and
wherein the control unit is configured to determine a corrected discharge timing by correcting the discharge timing before correction based on the supply position and the target position.

* * * * *